(12) United States Patent
Amy et al.

(10) Patent No.: US 6,667,102 B1
(45) Date of Patent: Dec. 23, 2003

(54) SILICON LAYER HIGHLY SENSITIVE TO OXYGEN AND METHOD FOR OBTAINING SAME

(75) Inventors: Fabrice Amy, Andresy (FR); Christian Brylinski, Neuilly sur Seine (FR); Gérald Dujardin, Châtenay Malabry (FR); Hanna Enriquez, Paris (FR); Andrew Mayne, Antony (FR); Patrick Soukiassian, St. Remy les Chevreuse (FR)

(73) Assignee: Commissariat A l'Energie Atomique, Paris (FR)

( * ) Notice: Subject to any disclaimer, the term of this patent is extended or adjusted under 35 U.S.C. 154(b) by 0 days.

(21) Appl. No.: 10/130,269
(22) PCT Filed: Nov. 27, 2000
(86) PCT No.: PCT/FR00/03304
§ 371 (c)(1), (2), (4) Date: May 24, 2002
(87) PCT Pub. No.: WO01/39257
PCT Pub. Date: May 31, 2001

(30) Foreign Application Priority Data

Nov. 25, 1999 (FR) .............................. 99 14846

(51) Int. Cl.$^7$ .......................... H01L 21/20; H01L 29/04; B32B 9/00
(52) U.S. Cl. ................ 428/446; 428/448; 428/698; 427/255.18; 427/314; 427/397.7; 117/95; 117/106
(58) Field of Search ................... 428/446, 448, 428/698; 427/255.18, 314, 397.7; 117/95, 106, 935

(56) References Cited

U.S. PATENT DOCUMENTS 6,214,107 B1 * 4/2001 Kitabatake ................. 117/95
6,274,234 B1   8/2001 Dujardin et al. ............ 428/336

FOREIGN PATENT DOCUMENTS

DE   34 34 727    4/1985
EP   0 637 069    2/1995
JP   11 067757    3/1999

OTHER PUBLICATIONS

J. Tan et al.: "Metal–oxide–semiconductor capacitors formed by oxidation of polycrystalline silicon on sic" Applied Physics Letters, vol. 70, No. 17, pp. 2280–2281 Apr. 28, 1997.

A.V. Zotov et al.: "Si(100)4*3–In surface phase: identification of silicon substrate atom reconstruction" Surface Science, vol. 391, No. 1–3, pp. L1188–L1193 (Abstract Only) Nov. 26, 1997.

* cited by examiner

Primary Examiner—John J. Zimmerman
Assistant Examiner—Stephen Stein
(74) Attorney, Agent, or Firm—Oblon, Spivak, McClelland, Maier & Neustadt, P.C.

(57) ABSTRACT

A highly oxygen-sensitive silicon layer (2) is formed on a substrate (4) of, for example, SiC. The layer (2) has a 4×3 surface structure. The silicon layer (2) is deposited on a surface of the substrate (4) in a substantially uniform manner. The highly oxygen-sensitive silicon layer of the present invention may be used, for example in microelectronics.

13 Claims, 1 Drawing Sheet

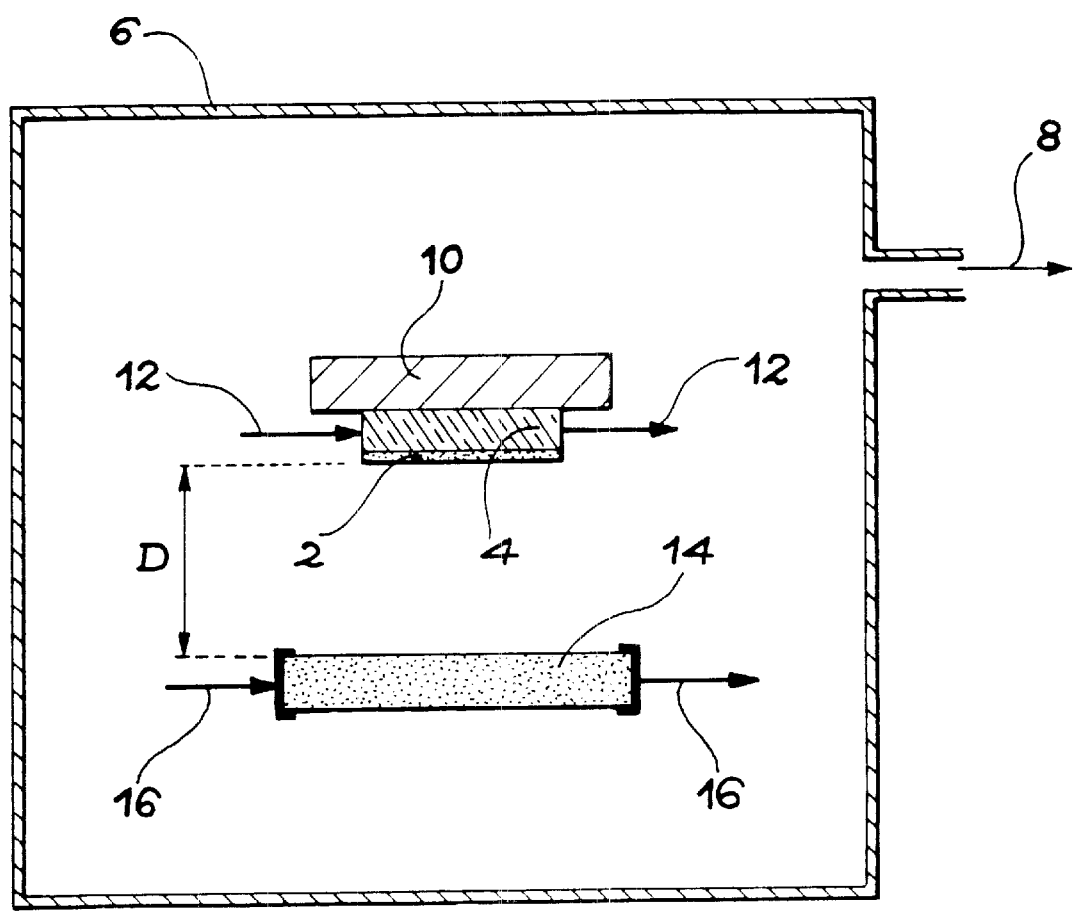

SILICON LAYER HIGHLY SENSITIVE TO OXYGEN AND METHOD FOR OBTAINING SAME

TECHNICAL FIELD

The present invention relates to a silicon layer which is highly sensitive to oxygen as well as to a method for obtaining this layer.

It is notably applied to microelectronics.

PRIOR STATE OF THE ART

Silicon carbide (SiC) is a very interesting compound semiconducting material IV—IV, which is particularly suitable for high power, high voltage or high temperature devices and sensors.

Recently, very significant advances have been accomplished in the understanding of the surfaces of this material and of the SiC interfaces with insulators and metals.

Two of the important issues for the success of SiC-based electronic devices (and particularly those which are based on hexagonal polytypes of this material) relate to obtaining high performance MOS transistors, surface passivation and therefore oxidization of SiC, and the insulating structure on SiC.

Let us note that silicon is presently the most used semiconducting material, mainly because of the exceptional properties of silicon dioxide ($SiO_2$).

From this point of view, SiC is of particular interest as its surface passivation may be achieved by growing $SiO_2$ under conditions similar to those for silicon.

However, because of the presence of carbon, conventional oxidization (direct SiC oxidization) of the SiC surfaces (particularly of the hexagonal surfaces of this material) generally leads to the formation of Si and C oxides, which have poor electrical properties, and to $SiO_2$/SiC interfaces which are not sharp, the transition between SiC and $SiO_2$ occurring over several atomic layers.

Electron mobility in the MOS structure inverting layers on p-SiC is much lower (by a factor 10) than on silicon, because of disorder at the interface.

DISCUSSION OF THE INVENTION

The object of the present invention is to find a remedy to the above drawbacks.

Its object is a silicon layer which favors the growth of an oxide on a substrate considerably and leads to a $SiO_2$/substrate interface which is sharp, the transition between the substrate and $SiO_2$ virtually occurring over a few atomic layers.

Specifically, the object of the present invention is a silicon layer formed on a substrate, this layer being characterized in that it has a 4×3 surface structure (it is also said to be 4×3 reconstructed), the substrate being able to receive this 4×3 surface structure of silicon or suitable for favoring the formation of this structure.

Preferably, the substrate is made out of a material selected from silicon carbides and silicon.

The silicon carbide may be monocrystalline (cubic, hexagonal (more than 170 polytypes) or rhombohedral form), polycrystalline, amorphous, or porous.

As an example, the layer is formed on a 6H—SiC (0001) surface, a reconstructed 3×√3×√3, 6√3×6√3 or 1×1 surface for example.

The present invention also relates to a method for obtaining the layer, object of the invention.

According to this method, silicon is deposited on a surface of the substrate in a substantially uniform way.

According to a preferred embodiment of the method, object of the invention, a surface of the substrate is prepared for receiving the silicon layer, the substrate is heated to a high temperature, at least 1000° C., silicon is deposited onto the surface of the thereby heated substrate in a substantially uniform way, at least one annealing of the substrate is performed, whereon silicon is deposited at least at 1000° C., the total annealing time being of at least 5 minutes, and the substrate is cooled at a rate of at least 100° C./minute.

Preferably, when the substrate is made out of a monocrystalline silicon carbide, silicon is deposited on this substrate heated to about 650° C., the substrate is then annealed at 650° C. at the least, the total annealing time being of at least 7 minutes, and then cooled at a rate of at least 50° C./minute.

Preferably, particularly when the substrate is made out of monocrystalline silicon carbide, the preparation of the surface of the substrate for receiving the monocrystalline silicon and/or for promoting its formation, comprises auxiliary heating of the substrate to at least 1000° C., auxiliary substantially uniform deposition of monocrystalline silicon on the surface of the thereby heated substrate and at least one auxiliary annealing of the substrate after this auxiliary deposition, at 650° C. at the least, with the total auxiliary annealing time being of at least 7 minutes.

Before the auxiliary heating, the preparation of the surface of the substrate preferably comprises degassing of the substrate under ultra-high vacuum and then at least one annealing of this substrate and then a cooling of the substrate.

In the present invention, silicon is preferably deposited by vacuum evaporation.

According to a preferred embodiment of the invention, silicon is deposited from a surface of a silicon sample, this surface of the sample being larger than the surface of the substrate.

Preferably, the surface of the silicon sample and the surface of the substrate are separated by a distance of the order of 2 to 3 cm.

The present invention also relates to a method for obtaining a silicon dioxide layer, characterized in that a silicon layer is made on a substrate in accordance with the method for obtaining a silicon layer, object of the invention, and this silicon layer is oxidized.

SHORT DESCRIPTION OF THE DRAWING

The present invention will be better understood upon reading the description of exemplary embodiments given hereafter, as purely indicative and by no means limiting examples, with reference to the single appended figure which schematically illustrates the making of a silicon layer according to the invention.

DETAILED DISCUSSION OF PARTICULAR EMBODIMENTS

According to an example of the invention, a thin silicon film is deposited beforehand (the thickness of which is at least 0.5 nm (i.e. several silicon atomic planes) for example) on a hexagonal SiC surface.

Oxidization of the latter is then facilitated considerably.

It takes place at a low temperature (below 500° C.) and it leads to the formation of a sharp $SiO_2$/SiC interface and of a $SiO_2$ oxide film without any carbon atom.

The inventors have identified the structure of this thin silicon film on the surface of SiC by scanning tunneling microscopy.

This thin film has a 4×3 surface structure, the formation of which is not comprised in the state of the art.

This structure has a very large reactivity towards oxygen.

Its sensitivity to this gas is exceptional: it reacts to an oxygen exposure of less than one langmuir i.e. less than $10^{-6}$ torr.second (about $10^{-4}$ Pa·s) whereas the corresponding surfaces of hexagonal SiC, cubic SiC, Si(100) or Si(111) are much less reactive and even almost inert towards such a low exposure.

An example for preparing a silicon layer according to the invention will now be given.

In this example, a monocrystalline 6H—SiC silicon carbide sample is used, which is commercially available from Epitronics.

The face used of this sample is the silicon type (0001) face.

It ends in silicon with a low density of steps.

As a pure indication and by no means a limitation, this sample has a length of 13 mm, a width of 5 mm and a thickness of about 300 µm.

One starts with preparing a clean 3×3 reconstructed 6H—SiC (0001) surface.

A rinsing of the sample is first performed with ethanol.

Then, the silicon carbide sample is introduced into an ultra-vacuum chamber wherein a pressure of the order of $3 \times 10^{-9}$ Pa is established and wherein this sample is directly Joule heated by passing an electrical current through the sample.

The temperature of the latter is measured by means of an infrared pyrometer.

In the relevant example, the working wavelength λ of the pyrometer is 0.9 µm and the emissivity ϵ of the silicon carbide sample is 0.53.

First of all, the sample is degassed by leaving it for 24 hours at 650° C. under ultra-high vacuum.

The sample then undergoes a series of annealings until no contaminants are detected:

For example, the sample is heated to 1000° C. for 3 minutes, then to 1100° C. for 1 minute, and then to 1200° C. for 1 minute.

The sample is then slowly cooled (for example at a rate of 100° C. per minute) to the room temperature (about 20° C.).

Then, for 10 minutes, by means of vacuum evaporation performed by means of a clean silicon sample (the length of which, as an example, is 20 mm and the width 10 mm) which is heated to 1150° C., silicon is uniformly deposited over the surface of the silicon carbide sample brought to 650° C.

During this deposition, the silicon carbide sample and the silicon sample are facing each other and are at a distance D of 2 cm from one another.

The larger surface of the silicon sample provides homogeneity, i.e. uniformity, of the silicon deposit on the silicon carbide sample.

Finally, for the SiC sample thereby covered with silicon, the series of annealings described above are repeated: this sample is heated to 1000° C. for 3 minutes, and then to 1100° C. for 1 minute and then to 1200° C. for 1 minute.

In the following, the formation of a thin Si layer with a 4×3 surface structure (square mesh) on the clean 6H—SiC silicon carbide surface(0001) which may be reconstructed as 3×3 for example, will be explained.

A uniform deposition of silicon is performed for 13 minutes under identical conditions with those described for the preparation of the clean surface: for 10 minutes, by vacuum evaporation performed by heating the silicon sample to 1150° C., the SiC sample being brought to 650° C.

And then a series of annealings of the silicon carbide sample are carried out; 1 minute at 750° C., and then 1 minute at 700° C. and then 5 minutes at 650° C.

This sample is then slowly cooled down to room temperature, for example, at a rate of 50° C. per minute.

The 6H—SiC (0001) surface thereby obtained includes vast 4×3 reconstructed domains (square lattice cell) which coexist with other 3×3 reconstructed domains (hexagonal lattice cell).

The 4×3 reconstructed areas have dimensions of the order of 550 nm×450 nm, are almost free of steps and have a few islands forming bands with a length of several hundred nanometers, a width of a few tens of nanometers and a height of about 0.3 nm.

The single appended figure very schematically illustrates the making of this 4×3 structure silicon layer 2, on the clean surface of the 3×3 reconstructed 6H—SiC (0001)substrate 4.

The chamber 6 in which preparation of the substrate 4 and formation of the layer 2 take place, is also seen.

The pumping means for obtaining an ultra-high vacuum are symbolized by the arrow 8.

The substrate 4 is mounted on a suitable support 10 and the Joule-heating means for the substrate are symbolized by arrows 12.

Joule-heating means for the silicon sample 14 are also seen, these means being symbolized by arrows 16.

The silicon layer according to the invention, thereby obtained, has a structure and properties with no precedent.

It is highly sensitive to oxygen, so "mild" oxidizations may be performed (as compared with the methods generally used) at low temperatures i.e., lower than or equal to 500° C., and sharp $SiO_2$/SiC interfaces may be obtained and without any carbon in the $SiO_2$ layer.

It should be noted that silicon may be deposited in other ways, for example by chemisorption of silane or evaporation by electron bombardment.

The present invention is not limited to the formation of a 4×3 reconstructed Si layer on a 3×3 reconstructed 6H—SiC (0001) surface.

Other reconstructions of 6H—SiC (1000), for example √3×√3 or 6√3×6√3 reconstructions, other 6H—SiC faces, for example (0001) or other faces, other polytypes, for example 3C—SiC, or 4H—SiC, may also be used for forming a 4×3 reconstructed Si layer according to the invention, thereon.

Substrates of other materials, for example silicon, may also be used for forming thereon such a layer.

The present invention is very useful for making MOS devices, and in particular, MOSFET devices (MOS type field effect transistors).

It is also useful for passivation of any component, not only on silicon carbide, but also on silicon or other substrates on which such a 4×3 silicon structure may be deposited.

The silicon layer, object of the invention, is a thin layer, capable of being oxidized very easily at a very low temperature (below 500° C.) and even at room temperature (about 20° C.).

The thereby obtained silicon dioxide layer (SiO$_2$) (a) undergoes less damages under the impact of incident ionizing radiations than SiO$_2$ layers of the prior art, because it may be made at a lower temperature than for these layers, (b) is thin (it may have a thickness as small as 10 Å and less than or equal to 50 Å) and (c) has a sharp interface with the underlying substrate.

Moreover, the invention is extremely interesting in microelectronics: the capability of forming a thin SiO$_2$ layer on a SiC or Si substrate, from the 4×3 silicon layer obtained according to the invention, is extremely interesting for miniaturization of microelectronic devices.

Of course, documents relating to SiC are known, DE-A-34347727 (Sharp KK) (see also U.S. Pat. No. 5,272,107) Tan et al. Appl. Phys. Lett. 70(17), 1997, pp. 2280–2281 and JP-A-11067757. But they do not disclose a substrate able to receive the 4×3 surface structure of Si or suitable for favoring the formation of such a structure.

A method for obtaining SiO$_2$ passivation on SiC, is also known from document EP-A-0637069 (Cree Research, Inc.). However, the Si layer formed on SiC, in order to form the SiO$_2$ layer, has nothing to do with the layer, object of the present invention, which has a 4×3 surface structure. The technique disclosed in this document does not lead to such a structure. Moreover, in this document, obtaining the SiO$_2$ layer from the Si layer, requires heat oxidization at a high temperature (about 1000° C.), and at very high O$_2$ pressures (about atmospheric pressure) whereas the 4×3 Si layer of the invention is, as it was seen earlier, very easily oxidizable with very small O$_2$ amounts and at low temperature.

In addition, a 4×3 Si(100)/In structure is known from Zotov et al., Surface Science Lett., 391 (1997), pp. 1188–1193, which is completely different from the 4×3 Si layer of the present invention. Its lattice parameter is very different and it requires the presence of indium.

What is claimed is:

1. A silicon layer (2) formed on a substrate (4), wherein the layer (2) has a 4×3 surface structure, the substrate (4) is able to receive the 4×3 surface structure of silicon or favors the formation of the 4×3 surface structure of silicon, and the silicon layer (2) favors growth of silicon oxide on the substrate.

2. The silicon layer (2) according to claim 1, wherein the substrate (4) comprises a material selected from silicon carbides and silicon.

3. The silicon layer (2) according to claim 2, wherein the layer (2) is formed on a 6H—SiC (0001) surface.

4. The silicon layer (2) according to claim 3, wherein the 6H—SiC (0001) surface is reconstructed as 3×3, √3×√3, 6√3×6√3 or 1×1.

5. A method for obtaining the layer according to claim 1, comprising:

depositing silicon on a surface of the substrate (4) in a uniform way.

6. method according to claim 5, further comprising:

preparing a surface of the substrate (4) for receiving the silicon layer, heating the substrate (4) to at least 1000° C., depositing the silicon on the surface of the heated substrate (4) in a uniform way, performing at least one annealing of the substrate (4) whereon silicon is deposited at a temperature of at least at 1000° C. and an annealing time of at least 5 minutes, and cooling the substrate at a rate of at least 100° C./minute, wherein the substrate (4) comprises a material other than monocrystalline silicon carbide.

7. The method according to claim 5, further comprising:

depositing silicon on the substrate (4) heated to 650° C., then annealing the substrate (4) at a temperature of at least 650° C. for a total annealing time of at least 7 minutes, and then cooling the substrate (4) at a rate of at least 50° C./minute, wherein the substrate (4) comprises monocrystalline silicon carbide.

8. The method according to claim 5, wherein the preparation of the surface of the substrate (4) for receiving the monocrystalline silicon and/or promoting its formation, comprises:

auxiliary heating of the substrate (4) to a temperature of at least 1000° C., uniform auxiliary deposition of the monocrystalline silicon onto the surface of the heated substrate (4), and at least one auxiliary annealing of the substrate after the auxiliary deposition, at a temperature of at least 650° C. and a total auxiliary annealing time of at least 7 minutes.

9. The method according to claim 8, wherein the preparation of the surface of the substrate (4) further comprises, before the auxiliary heating, degassing the substrate under ultra-high vacuum and then at least one annealing of the substrate (4) and then cooling of the substrate (4).

10. The method according to claim 5, wherein silicon is deposited by vacuum evaporation.

11. The method according to claim 5, wherein silicon is deposited from a surface of a silicon sample (16), and the surface of the silicon sample (16) is larger than the surface of the substrate.

12. The method according to claim 11, wherein the surface of the silicon sample (16) and the surface of the substrate (4) are separated by a distance (D) of 2 to 3 cm.

13. A method for obtaining a thin silicon dioxide layer, wherein a silicon layer is prepared on a substrate according to the method of claim 5, then oxidizing the silicon layer.

* * * * *